United States Patent [19]

Roberts et al.

[11] 4,044,374
[45] Aug. 23, 1977

[54] SEMICONDUCTOR DEVICE HEADER SUITABLE FOR VACUUM TUBE APPLICATIONS

[75] Inventors: Charles Grady Roberts; Wayne W. Chan, both of Plano; Dean R. Collins, Dallas, all of Tex.

[73] Assignee: Texas Instruments Incorporated, Dallas, Tex.

[21] Appl. No.: 650,396

[22] Filed: Jan. 19, 1976

[51] Int. Cl.² .................... H01L 39/02; H01L 29/78; G01T 1/24; H01L 23/02
[52] U.S. Cl. ........................................ 357/80; 357/24; 357/74; 357/29
[58] Field of Search ........................ 357/24, 80, 29, 74

[56] References Cited

U.S. PATENT DOCUMENTS

| | | | |
|---|---|---|---|
| 3,509,430 | 4/1970 | Mroz | 357/80 |
| 3,568,012 | 2/1971 | Ernst et al. | 357/80 |
| 3,641,254 | 2/1972 | Bunting et al. | 357/80 |
| 3,943,623 | 3/1976 | Mizutani et al. | 357/80 |

OTHER PUBLICATIONS

Proc. Sym. on CCD Tech. for Scientific Imaging Applications, Cal. Tech., June 1975; Collins et al.
Inter. Conf.-Tech. and Applications of CCD's-Univ. of Edinburgh, Sept. 25-27, 1974; Gray et al.
Inter Conf. on Applications of CCD's-Oct. 29-31, 1975; Barton et al.

*Primary Examiner*—Edward J. Wojciechowicz
*Attorney, Agent, or Firm*—Harold Levine; Rene' E. Grossman; James T. Comfort

[57] ABSTRACT

A disk shaped ceramic support has a mounting surface provided as a unitary part of the support with conductors extending generally outward from the mounting surface through the thickness dimension of the support, the outer ends of the conductive leads being connected to a ring of terminal leads. A charge coupled device (CCD) imager chip is secured to the mounting surface to leave a backside illumination surface of the chip unobstructed and electrical interconnections are made from terminal pads on the front surface of the chip to the ends of the conductive leads adjacent the mounting surface. A cover plate attached to the insulating support outwardly of the interconnections encloses the front surface of the chip. In a preferred structure the chip is mounted on an apertured molybdenum disk unitarily attached to the support with the illumination surface of the CCD chip facing the aperture. A peripheral tube flange can be brazed to the periphery of the insulating support and a tubular enclosure vacuum sealed to the tube flange for accommodating a photo-cathode source which faces the illumination surface of the imager chip. In a further embodiment, the front side of the chip is attached directly to a mounting surface provided by the insulating support itself, connections between the terminal pads on the chips and the conductive leads of the support being effected therough apertures in the support located adjacent corners of the chip.

22 Claims, 17 Drawing Figures

- Tube Flange
- 24
- 33 Connector Pins
- 37
- 22
- Seal Flange
- 12
- Moly Alloy Stage
- 20, 18, 16, 14
- Bond Pad Metallization
- 21
- Buried Metallization
- Ceramic Substrate

- Accelerating Potential 5-25KV
- Photocathode
- 44, 46
- Incident Image
- Accelerated Photoelectrons
- Vacuum
- 40
- 28
- Secondary Electrons
- Electrical Connections
- 24
- 26
- CCD Imager

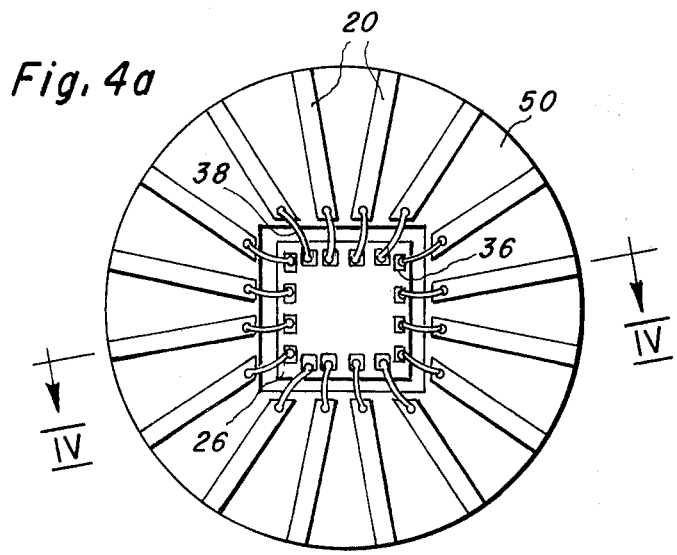
*Fig. 4a*
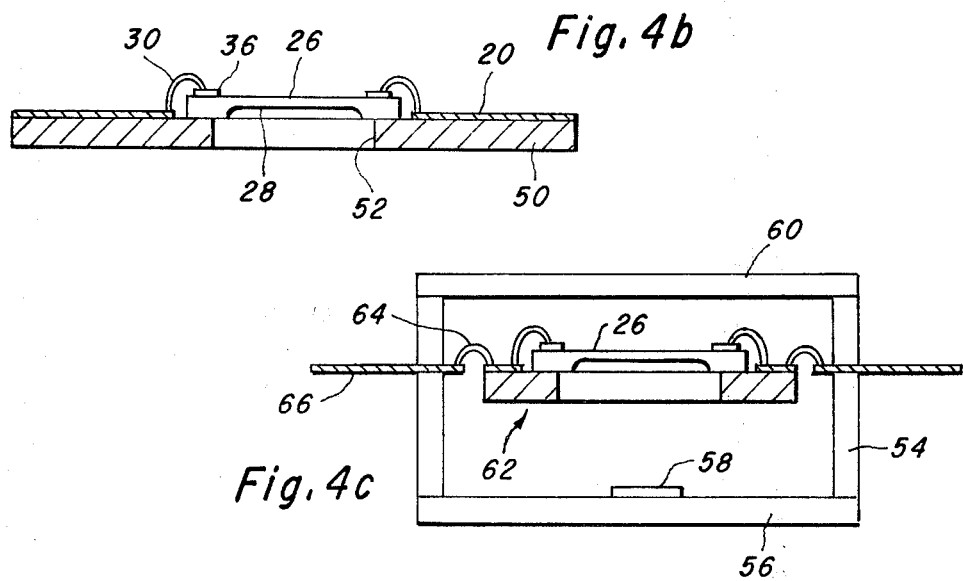
*Fig. 4b*
*Fig. 4c*
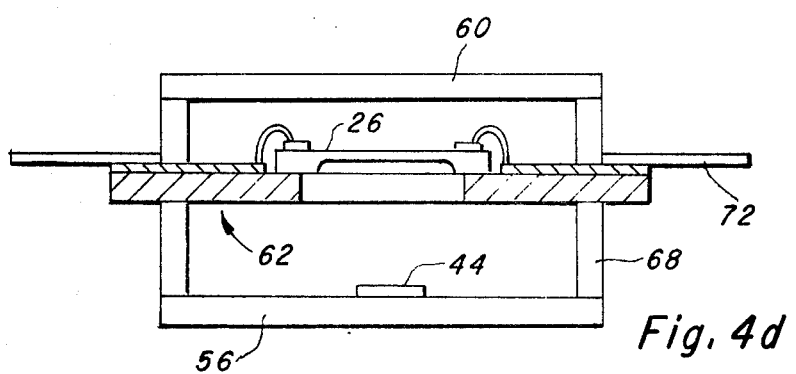
*Fig. 4d*

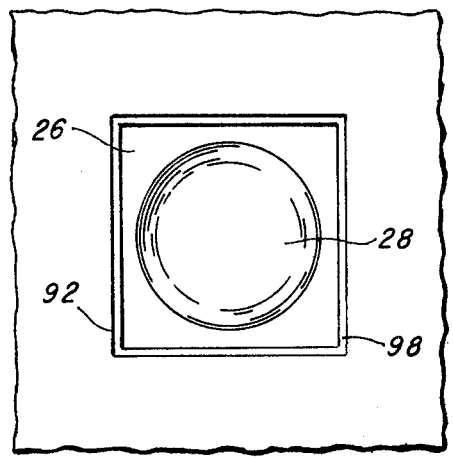
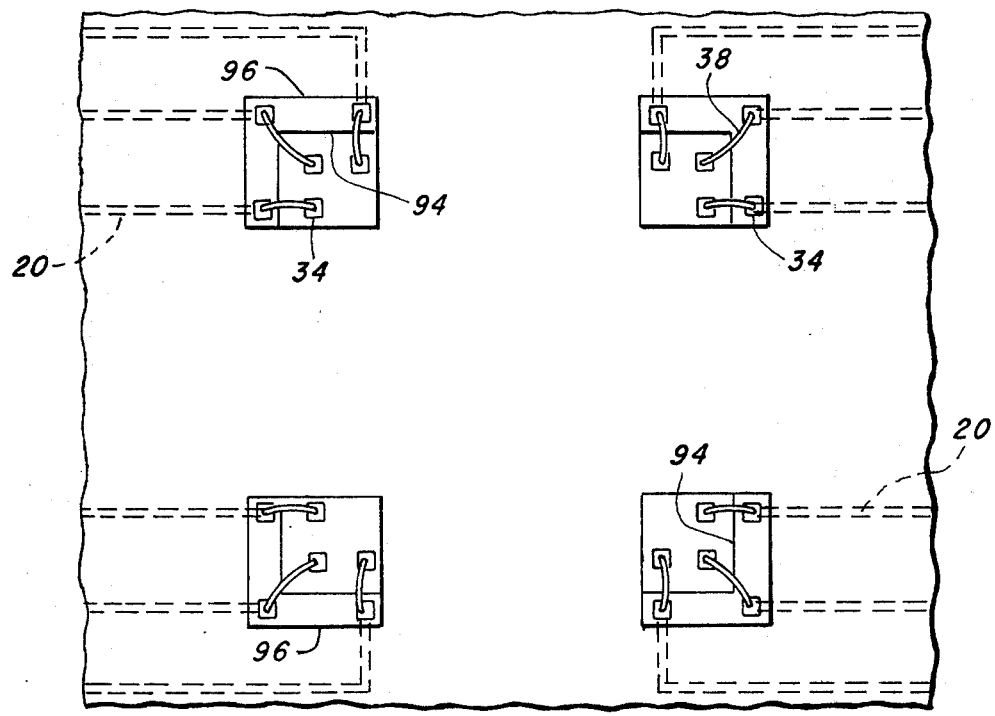

SEMICONDUCTOR DEVICE HEADER SUITABLE FOR VACUUM TUBE APPLICATIONS

This invention relates to header devices for semi-conductor photo-electric elements, more particularly for charge transfer imager devices, and to structures incorporating such header assemblies.

It is desirable to provide such a header assembly wherein the illumination surface of the device is not subject to obstruction, wherein the semiconductor element may be mounted with minimal possiblities of damage thereto during assembly, and wherein electrical connections between terminal pads of the semiconductor element, conductors forming part of the header assembly and external terminal leads to the conductors may relatively easily be effected. When the header assembly itself is to form part of the closing wall of an eventual structure incorporating the header assembly, a vacuum seal along the length of the conductive paths between the external terminal pins and the interior of the structure also is required.

The present invention provides a header assembly including a charge transfer device chip having a plurality of spaced apart terminal pads at one surface thereof. The charge transfer device chip is fixedly mounted on a mounting surface provided as a unitary part of an insulating support, leaving the illumination surface of the chip unobstructed. Electrical interconnections are made between the terminal pads and conductive leads fixed to the support member and extending generally outwardly from the mounting area. Cover means surrounds the chip in hermetically sealed relation with the insulating support to enclose the electrical interconnections. The conductive leads extend beyond the cover means and are vacuum sealed along the lengths thereof between the interior and exterior of the cover means. Terminal leads are secured and electrically connected to the conductive leads externally of the cover means.

In a preferred header assembly, the charge transfer device has an illumination surface on a surface of the chip opposite from the surface at which the terminal pads are located, and the illumination surface may be provided at a locally thinned region of the charge transfer device chip.

The mounting area of the support may then comprise a seating surface surrounding an aperture in the insulating support, the aperture being aligned with the illumination surface. Advantageously the seating surface comprises a material which is thermally compatible with the semiconductor material of the charge transfer device chip, for example when using a silicon chip a molybdenum seating surface may be utilized.

Header assemblies embodying the invention may be utilized in constructing, for example, photo-inverter imaging tube structures, proximity tube structures, and imager devices.

For a more detailed description of illustrative features of the invention, several embodiments thereof will be described in further detail with reference to the drawings wherein:

FIGS. 4a and 4b are, respectively, pictorial plan and sectional views of another embodiment of the invention;

FIGS. 4c, 4d and 4e are pictorial sections of structures incorporating the header assembly shown in FIGS. 4a and 4b;

FIGS. 9 and 10 are, respectively, top and bottom plan views of part of FIGS. 7 and 8.

Figure 1:
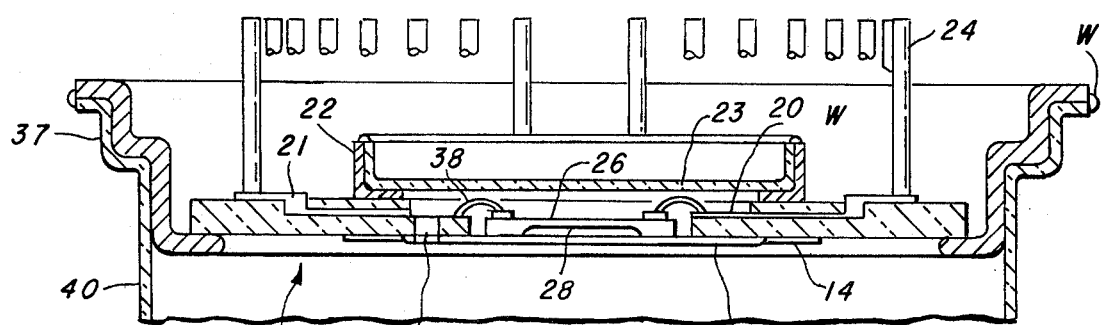
FIG. 1 is a section of a header assembly embodying the invention along the line II—II of FIG. 2.
Figure 2:
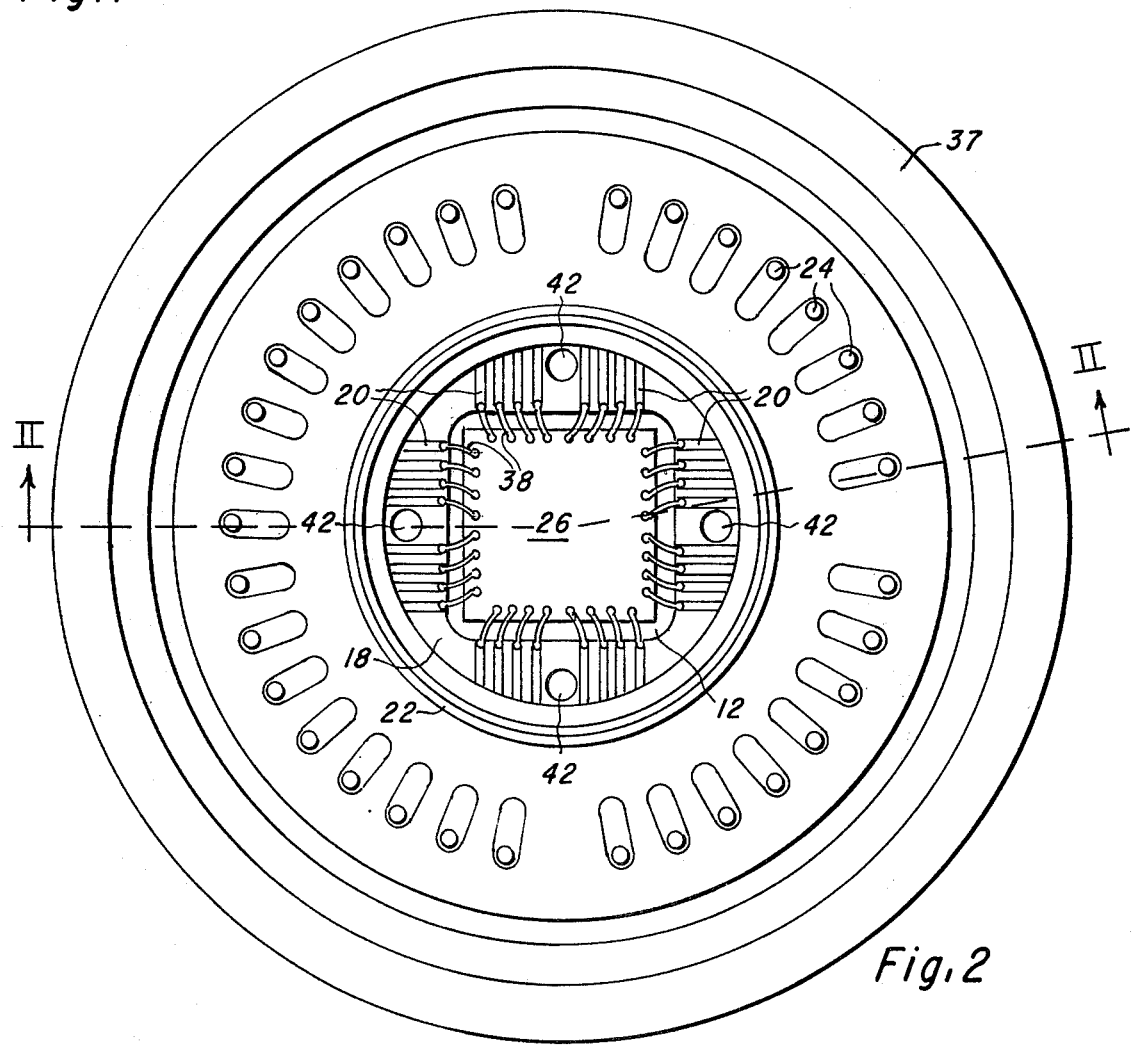
FIG. 2 is a top plan view of FIG. 1.
Figure 3:
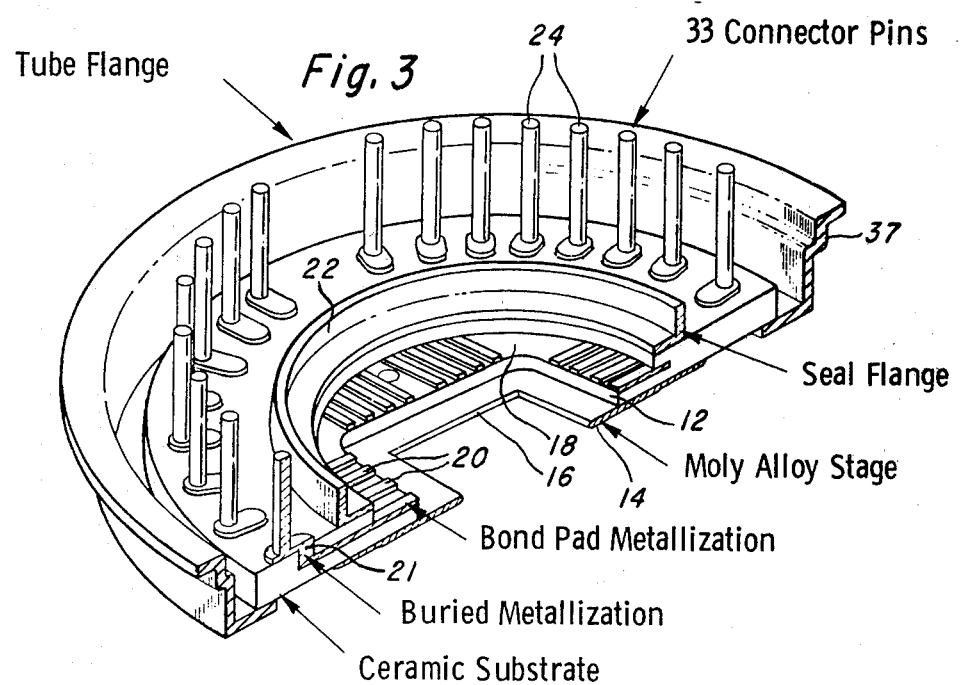
FIG. 3 is a sectioned, isometric view of the assembly shown in FIGS. 1 and 2.

The header assembly shown in FIGS. 1 to 3 includes a disk-shaped insulating support 10, suitably ceramic, having a central rectangular aperture 12 on the underside of which, as seen in FIGS. 1 and 3, is brazed a metal disk 14 having a central rectangular aperture 16. Adjacent the aperture 12, the insulating support 10 has a thinned annular portion 18 to the depressed upper surface of which (FIGS. 1 and 3) electrically conductive leads 20 are bonded, the leads extending generally outwardly from the aperture 12 buried within the thickness dimension of the support 10 (being hermetically sealed thereto along the lengths of the conductors 20) beyond a seal flange 22. The seal flange 22 is suitably made of KOVAR and is brazed to a metal ring screen printed on the upper surface of the insulating support 10 adjacent the periphery of the aperture 12. The conductors 20 have feed through portions 21 at the outer ends thereof to which are secured terminal pins 24 surrounding the sealing flange 22 and extending concentrically therewith.

A semiconductor imager device, shown as a charge coupled device (CCD) image chip 26 (the construction of which may be conventional and need not be described in detail herein) is mounted on the metal disk 14. The chip 26 has a locally thinned central area defining an illumination surface 28 on the lower side thereof (FIG. 1) which is positioned in facing alignment with the aperture 16 in the disk 14, a thickened area 30 of the chip 26 which surrounds the illumination surface being alloyed to the metal disk 14. The upper surface of the chip 26 includes various electrodes including phase-electrodes on an insulating layer on the surface of the semiconductor chip and overlying the thinned illumination surface 28 of the chip. Electrical conductors to the electrodes and other conventional structures, e.g. signal input and output structures, of the CCD device are formed on the insulating layer on the upper surface of the chip in conventional manner and extend over that surface to conductive terminal pads 36 adjacent the edges of the chip. Wire connections 38 are bonded between the terminal pads 36 and the exposed portions of the conductive leads 20 adjacent the aperture 12. One of the conductive leads 20 is electrically connected with the disk 14.

The structure so far described provides a compact and rugged header assembly for the CCD imager chip.

Figure 3A:
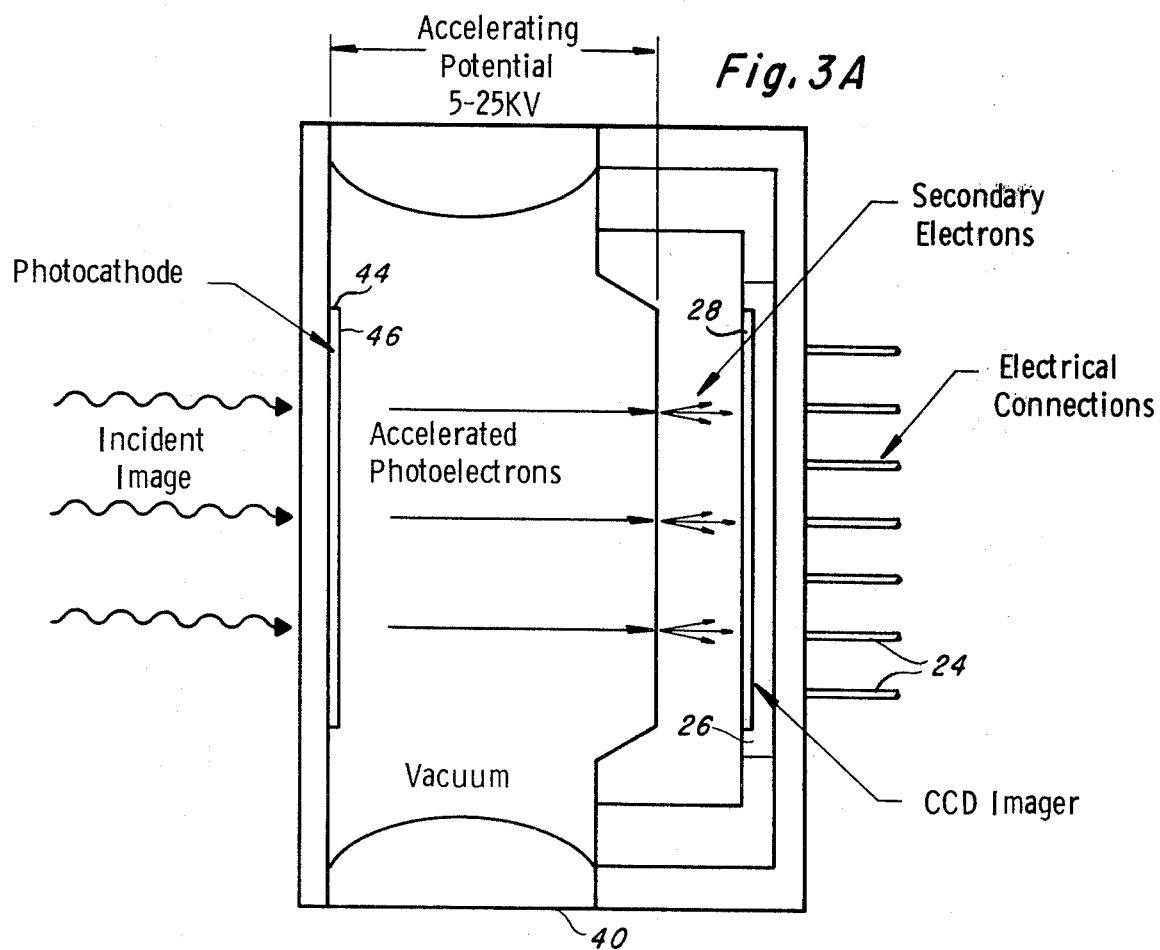
FIG. 3a is a pictorial section of a proximity tube including the header assembly of FIGS. 1 - 3.

In a particular application of the header assembly in conjunction with a photo-cathode source to provide a proximity tube structure, as depicted in FIG. 3a, the insulating support 10 is attached to a peripheral cup-shaped flange 37 in vacuum-tight sealed relation therewith and, in turn, an enclosing tubular member 40 is vacuum-tight sealed to the flange. The sealing flange 22 is closed by a cover member 23 vacuum-tight sealed thereto and a vacuum drawn within the enclosure. The insulating support 10 includes apertures 42 for equalizing the pressure on both sides of the CCD chip 26.

A photo-cathode 44 is mounted in a radiation-transmissive end wall of the tubular enclosure 40, the emission surface 46 of the photo-cathode facing the illumination surface 28 of the CCD chip. The photo-cathode 40 may be of conventional structure, for example as described in Kazan, B. and Knoll, M., *Electronic Image Storage*, Chapter 1, Sect. C, pp. 51-67, Academic Press, N.Y., 1968.

In fabrication of the structure shown in FIGS. 1 to 3, the conductive leads 20 are first screen printed in conventional manner on the surface of an unfired (green) ceramic disk, suitably 94% alumina, in which the aperture 12 has been punched, and then covered by a second annular ceramic disk, again suitably 94% alumina, positioned to define the depressed surface 18 on which the leads 20 are exposed adjacent the aperture 12. The feed through members 21 are also formed at this stage. The resultant assemblage is then fired to produce a unitary assembly comprising the insulating support, conductive leads 20 extending to the feed-through members 21 and vacuum-tight sealed within the thickness dimension of the insulating support 10 as shown in FIGS. 1 to 3. The metal disk 14, sealing flange 22, and flange 38 are then brazed onto metal surfaces previously screen printed on the support member 10. The molybdenum disk 14 is preferably extended in diameter to occupy the whole impingement area of electrons from the photo-cathode, to provide an equipotential surface on the support 10, and so preventing localized charge build up of the support surface. Then the terminal pins 24 are brazed to the terminal members 21. The exposed surfaces of the conductors 20, metal disk 14 and terminal pins 24 are gold plated prior to the surface oxidation thereof.

The CCD chip is then positioned on the metal disk 14 with the illumination surface 28 facing and exposed by the aperture 16 and gold alloyed to the disk 14. The metal disk 14 provides a thermally compatible support surface for the chip 26 and when, as is typical, the chip is a silicon chip the disk 14 suitably is a molybdenum or tungsten disk. The wire bonds 38 are then effected between the terminal pads 36 and the ends of the conductive leads 20 adjacent the aperture 12.

A dish-shaped KOVAR cover plate 23 is then welded to the rim of the seal flange 22 suitably made of KOVAR, to effect a vacuum-tight seal therewith. After mounting the tubular enclosure 40, with the photo-cathode 44 disposed in the end wall thereof in facing relation with the illumination surface 28 of the CCD chip 26, the tubular member 40 is welded to the cup-shaped flange 37 again to effect a vacuum-tight seal therewith. The welds — shown at W — are preferably effected using an inert-gas or non-oxidizing atmosphere welding process, e.g. a helium-arc welding process.

The resulting structure is then subjected to a bake-out cycle, suitably within the temperature range 300° to 500° C, dependent on the metal or metal-combination used for the conductor leads, to release any occluded gasses in the component parts of the structure and then a vacuum, typically $\leq 10^{-9}$ mmHg is pulled inside the structure. It will be appreciated that the component parts within the structure, including the insulating supports 10, the various conductors and the several seals and brazed joints must be capable of withstanding the temperature of the bake-out cycle and of maintaining the integrity of the vacuum during operation of the structure. Such materials are known in the tube sealing and semiconductor art and need not further be identified.

Furthermore the location of the conductors 20 buried within the thickness dimension of the support 10 is an advantageous manner of maintaining the hermetic integrity of the seal between the leads and the support material.

The header assembly described with relation to FIGS. 1 to 3 is useful in the construction of a proximity tube, as shown in those figures, but also may be employed, for example, in constructing an inverter tube wherein the photo-cathode would be mounted facing and separated from the illumination surface 28 of the CCD chip 26 by an electrostatic or magnetic lens system.

Furthermore, it is to be appreciated that the header assembly described with reference to FIGS. 1 to 3 may be useful in providing an imaging structure wherein a window, for example a quartz window, covers the illumination surface 28 of the CCD imager and is sealed to the surface of the support 10. Such a structure would be useful, for example, in a space environment, since condensation on the window and the imager surface 28 would be obviated. In such a structure, the flange 37 would not be essential.

A further embodiment of the invention is illustrated by FIGS. 4a to 4e, component parts which are the same as those shown in FIGS. 1 to 3 being identified by like references.

The header assembly shown in FIGS. 4a and 4b includes an insulating disk-shaped ceramic support 50 having a central aperture 52, a backside illuminated CCD imager chip 26 having its peripheral portion 30 alloyed to a metalized area of the support 50 so that the illumination surface 28 faces and is aligned with the aperture 52. The terminal pads 36 on the surface of the chip opposite from the illumination surface 28 are electrically connected by bonded wires 38 to conductive leads 20 screen printed on the surface of the support 50 and extending generally radially from the aperture 52.

Figure 4E:
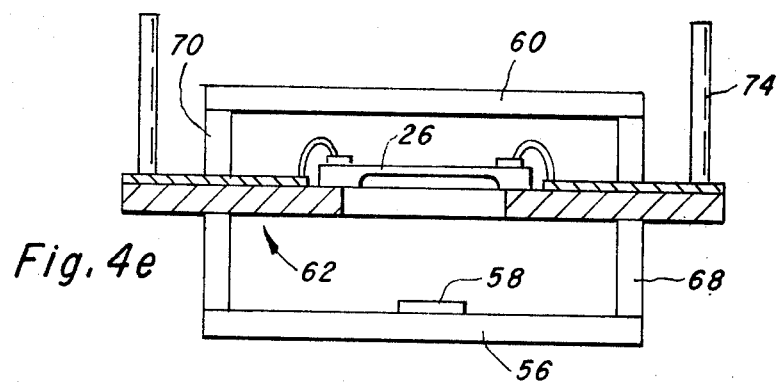

FIGS. 4c – 4e show completed structures incorporating the header assembly of FIGS. 4a and 4b. The structure shown in FIG. 4c includes a tubular ceramic wall 54 one end of which is closed by a ceramic plate 56 including a photo-cathode structure 58, and the other end by a ceramic coverplate 60, to provide a vacuum-tight enclosure within which the header assembly 62 is attached by wires 64 between the conductors 20 and external terminal leads 66 extending in a coplanar array radially through the tubular member 54 and hermetically sealed therewith. The wires 64 have sufficient rigidity to securely maintain the assembly 62 in proper position during operation of the structure.

The structure shown in FIG. 4d is similar to that shown in FIG. 4c except that the insulating support 50 itself forms part of the wall of the enclosure, the first ceramic tubular member 68 being sealed to the underside of the support 50 and a separate ceramic tubular member 70 being sealed to the upper surface thereof, the conductive leads 20 extending externally of the tubular member 70 in hermetically sealed relation therewith. A coplanar ray of external conductor leads 72 is bonded to the conductors 20.

FIG. 4e shows an alternative to the structure of FIG. 4d, wherein a ring of terminal pins 74 are secured to the conductors 20 and extend concentrically with the tubular member 70.

Figure 5:
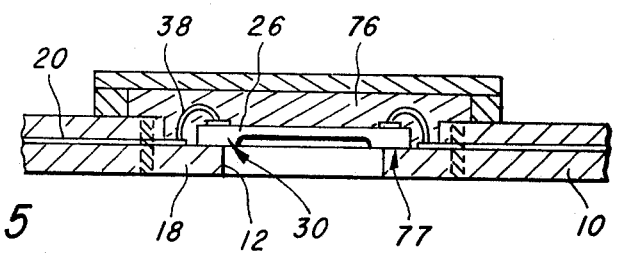
FIG. 5 is a section of part of a further embodiment of the invention.

FIG. 5 shows a modification of the header assembly shown in FIGS. 1 to 3 wherein the conductive leads 20 terminate short of the aperture 12, leaving a seating surface 77 of the annular portion 18, the CCD chip 26 being alloyed to a metalized portion of the surface 77. The space between the CCD chip 26 and the cover plate 23 may be filled with a material 76 to provide additional backing support for the CCD chip 26. For example, the material 76 may suitably comprise an epoxy resin. When fabrication of a structure incorporating the header assembly involves a bake cycle and operation of the structure requires maintenance of a vacuum-tight enclosure, the apertures 42 and regions between the chip and the apertures 42 would previously be hermetically sealed for example using a tin, lead or glass sealing material so that detrimental outgassing from the epoxy resin would be prevented.

Alternatively, the space between the CCD chip and the cover plate 23 may be left unfilled, the apertures 42 then providing pressure equilization on both sides of the CCD chip as described with reference to FIGS. 1 to 3.

Use of materials other than epoxy resin for the filler material 76 may pose problems in avoiding thermal stressing of the CCD chip 26 during high temperature firing cycle carried out after the chip has been mounted.

Figure 6:
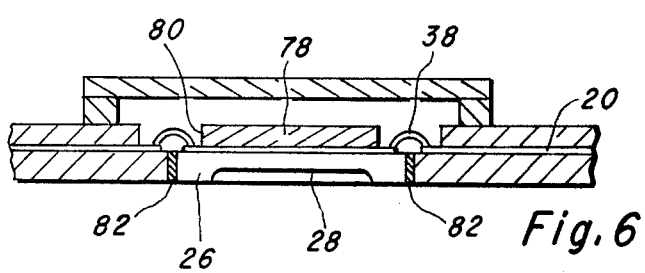
FIG. 6 is a section of part of a header assembly that is a modification of that shown in FIG. 5.

FIG. 6 shows an alternative structure to that of FIG. 5 in which the support 10 does not include a central aperture 12 but instead provides a mounting surface 78 to which the surface of the CCD surface opposite the illumination surface 28 is secured. The CCD chip is secured using a high grade epoxy resin, for example, such as that commercially available under the designation ABLESTICK 642-1. The terminal pads 36 are located adjacent corners of the CCD chip and aligned with separate apertures 80 through the insulating support 10 and through which the bonding wires 38 extend.

As will be noted in FIG. 6, the lower surface of the support 10 is recessed to accommodate the chip 26, the edges of which are secured to the walls of the recess 82 using a sealing material, again for example tin, lead, indium or glass, to ensure a hermetic seal so that the epoxy resin is not exposed to outgassing or vacuum conditions during fabrication and operation of a structure including the header assembly.

Another embodiment of a header assembly embodying the invention is shown in FIGS. 7 to 11.

The insulating support 84 is constructed using three ceramic layers 86, 88 and 90. While in a green or unfired state, an aperture 92 is punched in the layer 86 to accommodate the CCD chip 26 while apertures 94 are punched in the layer 88 to align with areas adjacent the corners of the CCD chip at which the terminal pads 38 are located, as shown in greater detail in FIG. 11. On the under side of the layer 88, conductor leads 20 are screen printed, the leads 20 extending to locations adjacent each of the apertures 94. The layer 90 includes apertures 96 that are oversize relative to the apertures 94 and registered therewith to expose end portions of the conductive leads 20. The structure thus far described is fired to produce a unitary assembly comprising the support 84.

Figure 7:
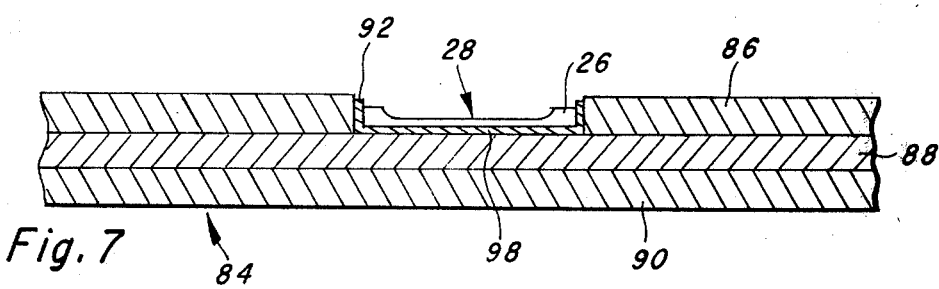
FIGS. 7 and 8 are pictorial sections through different parts of a further header assembly embodying the invention.
Figure 8:
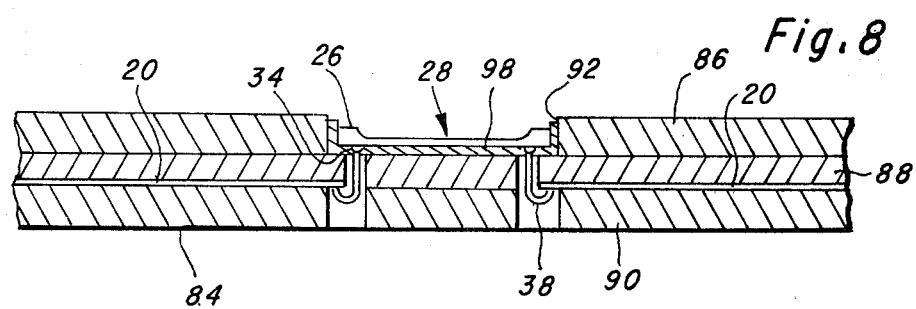

The CCD chip 26 is located and sealed in the recess 92 using an adhesive 98 such as, for example, glass or epoxy resin to seal the front (lower as seen in FIGS. 7 and 8) and peripheral surfaces of the CCD chip in the recess 92.

FIG. 7 is a part section of the header assembly in a region thereof at which no terminal pads 38 are located while FIG. 8 shows a similar part section through a region in which there are terminal pads 38, i.e. adjacent corners of the CCD chips 26. Both figures show the illumination surface 28 of the CCD chip facing the mouth of the recess 92 as also illustrated in the plan view of FIG. 9.

Figure 11:
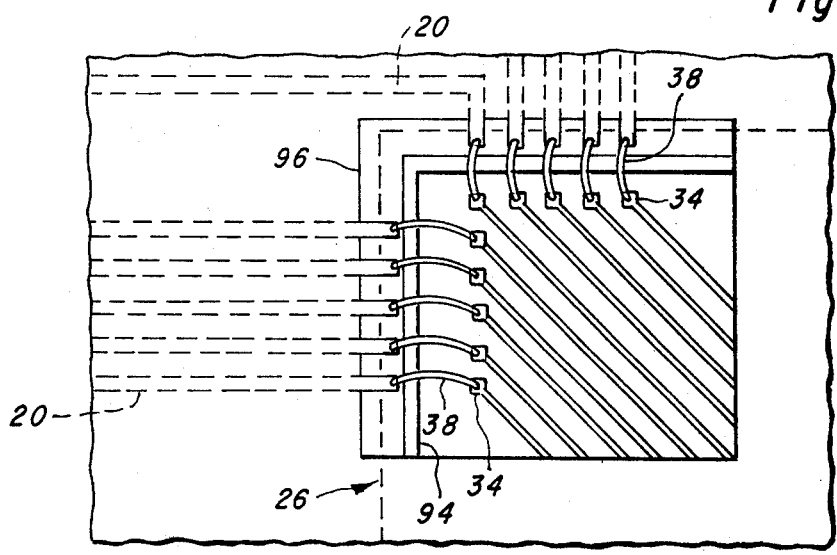
FIG. 11 shows an enlarged detail of FIG. 10.

The terminal pads 36 are connected to the conductive leads 20 by bonded wires 38 extending through the apertures 94, the apertures 96 providing access to effect the bonding operations. The particular locations of the terminal pads 36, conductive leads 20, bond wire 38 and apertures 94 and 96 are shown in more detail in FIGS. 10 and 11. FIG. 10 shows a lower plan view of part of FIG. 7 in the region of the CCD chip 26 while FIG. 11 shows a detailed plan view in the region of one of the apertures 96. If so desired the apertures 94 and 96 may be filled with epoxy resin.

In relation to each of the above structures, in choosing a suitable adhesive or sealing material, factors which may need to be considered include the amount of thermal cycling expected during the fabrication of the header assembly and during operation of a structure incorporating the header assembly; potentially deleterious effects of the adhesive or sealing material on the CCD chip; the vacuum integrity of the seals effected; ease of application, and, in the case of adhesive used as a backing material for the CCD chip, the uniformity of support behind the thinned area of the chip.

In relation to the structures described with reference to FIGS. 4e to 7, it will be appreciated that connection of external terminal pins to the outer ends of the conductors 20 may be effected as described with reference to the pins 24 in FIGS. 1 to 3, or radially extending terminal conductors may be provided as described with reference to FIG. 4c.

Figure 12:
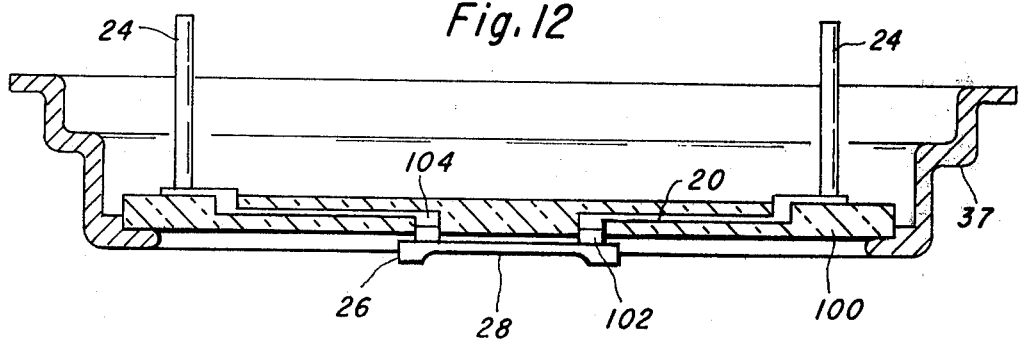
FIG. 12 is a cross-sectional view of another embodiment of a header assembly embodying the invention.

A further embodiment is depicted in FIG. 12 in which the ceramic support 100 includes conductive leads buried therein and terminating, at their inner ends, in bonding bump pads 104 which are aligned with and bonded to bonding bump pads 102 on the front (upper) surface of the CCD chip 26. The bonding process may be carried out using so-called flip chip bonding techniques known in the semiconductor art. It will be appreciated that FIG. 12 is diagrammatic only and that in practice, after the bonding operation, the front surface of the chip would be substantially flush with the underside of the support 100. This embodiment provides a relatively simple structure since the support requires no aperture for mounting the chip 26 and the bonded interconnections 38 are dispensed with thereby simplifying fabrication of the assembly.

What is claimed is:

1. A header assembly including a charge transfer device chip having a plurality of spaced apart terminal pads on one surface thereof, an insulating support; a mounting surface unitary with said support; a plurality of conductive leads affixed to said support member and extending generally outwardly from said mounting surface; means fixedly mounting said charge transfer device chip on said mounting surface; respective electrical interconnections between said terminal pads and said conductor leads; and cover means surrounding said chip in vacuum-tight sealed relation with said insulating support to enclose said electrical interconnection; said conductive leads extending beyond said cover means; means hermetically sealing said conductive leads along the lengths thereof between the interior and exterior of said cover means; and terminal leads electrically connected with said conductive leads externally of said cover means.

2. A header assembly according to claim 1 wherein said charge transfer device has an illumination surface on one surface of said chip opposite from the surface at which said terminal pads are located; and said mounting surface comprises a surface surrounding an aperture in said insulating support, said aperture being aligned with and exposing said illumination surface.

3. A header assembly according to claim 2, wherein said illumination surface is provided by a locally thinned area of said charge transfer device chip; and wherein said chip includes a peripherally thickened area surrounding said illumination surface positioned on and affixed to said mounting surface.

4. A header assembly according to claim 2 in combination with enclosure means vacuum-tight sealed to said header assembly and enclosing said illumination surface with a vacuum therein; and wherein said insulating support includes at least one aperture for equalizing pressure on opposite sides of said charge transfer device chip.

5. A structure according to claim 4, including photocathode means disposed within said enclosure means and facing said illumination surface.

6. A header assembly according to claim 1, wherein said conductive leads extend outwardly from said mounting area within the thickness dimension of said insulating support, said leads being exposed adjacent said mounting surface for making said electrical interconnections thereto.

7. A header assembly according to claim 1, including at least one aperture extending through said insulating support and aligned with said terminal pads on said charge transfer device chip, and wherein said electrical connections between said terminal pads and said conductor leads extend through said aperture.

8. A header assembly according to claim 1, wherein said charge transfer device chip is rectangular and said terminal pads are located adjacent a plurality of corners thereof; said mounting surface is provided by said insulating support; a plurality of spaced apertures extending through said insulating support and aligned with said terminal pads; wherein said electrical connections between said pads and said conductor leads extend through said apertures; and means sealedly affixing said charge transfer device chip to said mounting surface for providing between said chip and said mounting area a seal surrounding said apertures.

9. A header assembly according to claim 1, wherein said mounting surface comprises a member unitarily attached to said insulating support and comprising material providing a thermal match with the semiconductor material of said chip.

10. A header assembly according to claim 9, wherein said charge transfer device chip comprises a silicon chip and said mounting surface comprises molybdenum.

11. A header assembly according to claim 1, wherein said terminal leads extend in a coplanar array externally of said cover means.

12. A header assembly according to claim 1, including support material for said charge transfer device chip filling the space between said chip and said cover means.

13. A header assembly including a charge transfer device chip having a plurality of spaced apart terminal pads on one surface thereof and an opposite surface providing an illumination surface; a ceramic insulating support having a mounting surface unitary therewith and comprising a seating surface surrounding an aperture through the insulating support; said charge transfer device chip being fixedly secured to said seating surface with said illumination surface aligned with and facing said aperture and with said terminal pads remote from said aperture; a plurality of conductive leads extending generally outwardly from said mounting area within the thickness dimension of said insulating support, said conductive leads having exposed surfaces adjacent said mounting area; respective electrical interconnections between said terminal pads and said exposed portions of said conductive leads; cover means surrounding said charge transfer device chip in vacuum-tight sealed relation with said insulating support and enclosing said electrical interconnections; and a plurality of terminal leads electrically connected with said conductive leads exteriorly of said cover means.

14. A header assembly according to claim 13, wherein said seating surface comprises an apertured member fixedly secured to said insulating support, said apertured member comprising a material providing a thermal match with the semiconductor material of said charge transfer device chip.

15. A header assembly according to claim 14, wherein said apertured member comprises an apertured molybdenum disk and said charge transfer device chip comprises a silicon chip.

16. A header assembly according to claim 14, wherein said apertured member provides an equipotential surface surrounding said charge transfer device chip.

17. A header assembly according to claim 13, further including enclosure means sealed with said header assembly to maintain a vacuum within said enclosure; and photo-cathode means disposed in said enclosure means and facing the illumination surface of said charge transfer device chip.

18. A header assembly including a charge transfer device chip having a plurality of spaced apart terminal bonding pads on one surface thereof; an insulating support; a plurality of conductive leads imbedded within the thickness of said support; said conductive leads having outer ends exposed at a first surface of said support and inner ends connected with a spaced array of projecting bonding surfaces at the opposite surface of said support; said bonding pads of said charge transfer device chip being aligned with and directly bonded to said projecting bonding surfaces to mount said charge transfer device on said support with said bonding pads electrically and physically connected with said projecting bonding surfaces; and terminal leads electrically connected with said terminal surfaces on said first surface of said support; said charge transfer device chip further having an illumination surface on a surface thereof opposite said bonding pads.

19. A header assembly according to claim 1 wherein said cover means includes a ring-shaped metal member sealed in vacuum-tight relation with said insulating support and a metal cover member welded to said ring member in vacuum-tight relation therewith.

20. A header assembly according to claim 19, wherein said cover member is a dish-shaped member accommodated within said ring-shaped member.

21. A header assembly according to claim 20, wherein said metal cover member is welded to said ring-shaped member using a non-oxidizing atmosphere welding process.

22. A header assembly including a charge transfer device chip having a plurality of spaced apart terminal pads on one surface thereof and an opposite surface providing an illumination surface; a ceramic insulating support having a mounting surface unitary therewith and comprising a seating surface surrounding an aperture through the insulating support; said charge transfer device chip being fixedly secured to said seating surface with said illumination surface aligned with and facing said aperture and with said terminal pads remote from said aperture; a plurality of conductive leads extending generally outwardly from said mounting area within the thickness dimension of said insulating support, said conductive leads having exposed surfaces adjacent said mounting area; respective electrical interconnections between said terminal pads and said exposed portions of said conductive leads; and a plurality of terminal leads electrically connected with said conductive leads exteriorly of said cover means.

* * * * *